United States Patent
Hirose

(10) Patent No.: US 12,467,664 B2
(45) Date of Patent: Nov. 11, 2025

(54) ELECTROCALORIC EFFECT ELEMENT

(71) Applicant: Murata Manufacturing Co., Ltd., Nagaokakyo (JP)

(72) Inventor: Sakyo Hirose, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 816 days.

(21) Appl. No.: 17/831,471

(22) Filed: Jun. 3, 2022

(65) Prior Publication Data

US 2022/0307735 A1 Sep. 29, 2022

Related U.S. Application Data

(63) Continuation of application No. PCT/JP2020/030807, filed on Aug. 13, 2020.

(30) Foreign Application Priority Data

Dec. 23, 2019 (JP) .................. 2019-231472

(51) Int. Cl.
 *F25B 21/00* (2006.01)
(52) U.S. Cl.
 CPC ........ *F25B 21/00* (2013.01); *F25B 2321/001* (2013.01)
(58) Field of Classification Search
 None
 See application file for complete search history.

(56) References Cited

U.S. PATENT DOCUMENTS

| | | | | |
|---|---|---|---|---|
| 5,644,184 A | * | 7/1997 | Kucherov | G01J 5/34 |
| | | | | 310/306 |
| 5,949,071 A | * | 9/1999 | Ruffner | G01J 5/34 |
| | | | | 250/338.3 |
| 2011/0146308 A1 | * | 6/2011 | Casasanta | F25B 21/00 |
| | | | | 62/113 |
| 2020/0240000 A1 | * | 7/2020 | Gu | C23C 16/0272 |

FOREIGN PATENT DOCUMENTS

| | | | | |
|---|---|---|---|---|
| CN | 102901565 A | * | 1/2013 | |
| GB | 2347788 A | * | 9/2000 | ....... H01L 21/02197 |
| JP | 2016021574 A | | 2/2016 | |
| JP | 2017110838 A | | 6/2017 | |
| JP | 2017117910 A | | 6/2017 | |
| WO | 2016194700 A1 | | 12/2016 | |

OTHER PUBLICATIONS

Kim et al Dielectric Characteristics of Pb(Sc1/2-x Ta1/2+x)O3+x Ceramic System, The Korean Journal of Ceramics 1995 (Year: 1995).*

(Continued)

*Primary Examiner* — Jennifer McNeil
(74) *Attorney, Agent, or Firm* — Keating & Bennett, LLP

(57) ABSTRACT

An electrocaloric effect element includes a laminate including an electrode layer mainly including Pt and a ceramic layer that are stacked, in which the ceramic layer has a perovskite structure and mainly includes a ceramic including Pb, Sc, and Ta, where a content ratio of Sc is y, a content ratio of Ta is 1−y, and a range of the y is about 0.450≤y≤about 0.495.

20 Claims, 1 Drawing Sheet

(56) References Cited

OTHER PUBLICATIONS

Whatmore et al Sputtered lead scandium tantalate thin films . . . , Journal of Applied Physics, 1997 (Year: 1997).*
Battat et al A Model of Phase Transition Kinetics in Lead Scandium Tantalate Thin Films; Integrated Ferroelectrics, 2003 (Year: 2003).*
Brinkman et al Processing and properties of ferroelectric relaxor lead scandium tantalate Pb(Sc1/2 Ta1/2)O2 thin films J. Mater. Res. 2007 (Year: 2007).*
Chu et al., "Role of Defects in the Ferroelectric Relaxor Lead Scandium Tantalate," Journal of the American Ceramic Society, 1995, vol. 78, No. 7, pp. 1947-1952.
International Search Report in PCT/JP2020/030807, mailed Sep. 29, 2020, 3 pages.
Shebanovs et al., "Isomorphous ion substitutions and order-disorder phenomena in highly electrocaloric lead-scandium tantalate solid solutions," Ferroelectrics, 1996, vol. 184, pp. 239-242.
Sinyavsky et al., "The Optical Ferroelectric Ceramic as Working Body for Electrocaloric Refrigeration," Ferroelectrics, 1989, vol. 90, pp. 213-217.
Written Opinion in PCT/JP2020/030807, mailed Sep. 29, 2020, 3 pages.

* cited by examiner

ELECTROCALORIC EFFECT ELEMENT

CROSS REFERENCE TO RELATED APPLICATIONS

This application claims the benefit of priority to Japanese Patent Application No. 2019-231472 filed on Dec. 23, 2019 and is a Continuation Application of PCT Application No. PCT/JP2020/030807 filed on Aug. 13, 2020. The entire contents of each application are hereby incorporated herein by reference.

BACKGROUND OF THE INVENTION

1. Field of the Invention

The present invention relates to an electrocaloric effect element.

2. Description of the Related Art

In recent years, as a cooling element, a new solid cooling element and a new cooling system using an electrocaloric effect have attracted attention, and research and development thereof have been actively conducted. Compared with an existing cooling system using a refrigerant which is a greenhouse gas, there are advantages of high efficiency and low power consumption, and there is also an advantage of being quiet because no compressor is used. In order to obtain an excellent electrocaloric effect, it is necessary to be a ferroelectric which exhibits a primary phase transition in a desired temperature range and can apply a large electric field, and $PbSc_{0.5}Ta_{0.5}O_3$ (hereinafter, a ceramic containing Pb, Sc, and Ta is also referred to as "PST") is known as the most promising material. For example, Ferroelectrics, 184, 239 (1996) and Role of Defects in the Ferroelectric Relaxor lead Scandium Tantalate, J. Am. Ceram. Soc, 78 [71]1947-52 (1995) reports that $PbSc_{0.5}Ta_{0.5}O_3$ exhibits a large electrocaloric effect.

Although the above PST exhibits an electrocaloric effect, in order to obtain a larger electrocaloric effect, the following are required:

(1) a withstand voltage is high, and a large electric field can be applied; and (2) Sc and Ta which are cations at a B site of PST show a high order degree. That is, since an adiabatic temperature change ΔT which is one of performance indices of the electrocaloric effect depends on electric field strength applied, unless ceramic itself or an element has a high withstand voltage, a sufficient electric field cannot be applied, and a large adiabatic temperature change cannot be obtained. The electrocaloric effect is affected by the order degree at the B site of the PST. As the order degree at the B site is higher, more excellent ferroelectric characteristics are obtained, and a large electrocaloric effect (adiabatic temperature change) can be obtained.

However, in an element having a laminate structure in which an electrode layer made of Pt mainly including a noble metal and a PST ceramic layer are alternately stacked, variations in the withstand voltage and the order degree described above are large among lots, and it has been discovered that it is difficult to obtain the withstand voltage (for example, 20 MV/m or more) and the order degree (for example, 75% or more) for reproducibly obtaining a large electrocaloric effect. In order to obtain a high order degree, it is necessary to perform annealing treatment for a long time of 1000 hours or more, which causes a problem in productivity.

SUMMARY OF THE INVENTION

Preferred embodiments of the present invention provide elements each including a laminate in which an electrode layer mainly including Pt and a PST ceramic layer are alternately stacked and having a large electrocaloric effect, the elements each having high productivity.

As a result of intensive studies, the inventor of preferred embodiments of the present invention have discovered that the ceramic layer has a perovskite structure and mainly includes a ceramic including Pb, Sc, and Ta, and when a content ratio of Sc is "y", by using the ceramic in which the content ratio of Ta is "1–y" and a range of y is about 0.450≤y≤about 0.495, an element having a large electrocaloric effect and high productivity can be obtained.

An electrocaloric effect element according to a preferred embodiment of the present invention includes a laminate in which an electrode layer mainly including Pt and a ceramic layer are stacked, wherein the ceramic layer has a perovskite structure and mainly includes a ceramic including Pb, Sc, and Ta, and when a content ratio of Sc is "y", a content ratio of Ta is "1–y", and a range of the y is about 0.450≤y≤about 0.495.

An electrocaloric effect element according to a preferred embodiment of the present invention includes a laminate in which an electrode layer mainly includes Pt and a ceramic layer are stacked, wherein the ceramic layer has a perovskite structure and mainly includes a ceramic represented by the following formula:

x satisfies about 0.97≤x≤about 1.03,
y satisfies about 0.450≤y≤about 0.495, and
σ satisfies −0.1≤σ≤0.1].

In an electrocaloric effect element according to a preferred embodiment of the present invention, x satisfies about 0.985≤x≤about 1.015.

In an electrocaloric effect element according to a preferred embodiment of the present invention, the ceramic layer in the laminate has a thickness of about 50 μm or less.

An electronic component according to a preferred embodiment of the present invention includes an electrocaloric effect element according to a preferred embodiment of the present invention.

According to preferred embodiments of the present invention, it is possible to provide composite oxides each having a large electrocaloric effect and high withstand voltage and insulation property.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, electrocaloric effect elements according to preferred embodiments of the present invention will be described in detail with reference to the drawings. However, the shapes and arrangements of the electrocaloric effect elements and respective elements included therein according to preferred embodiments of the present invention are not limited to those in the illustrated examples.

Electrocaloric effect elements according to preferred embodiments of the present invention each include a laminate in which a Pt electrode layer and a ceramic layer are alternately stacked.

Figure 1:
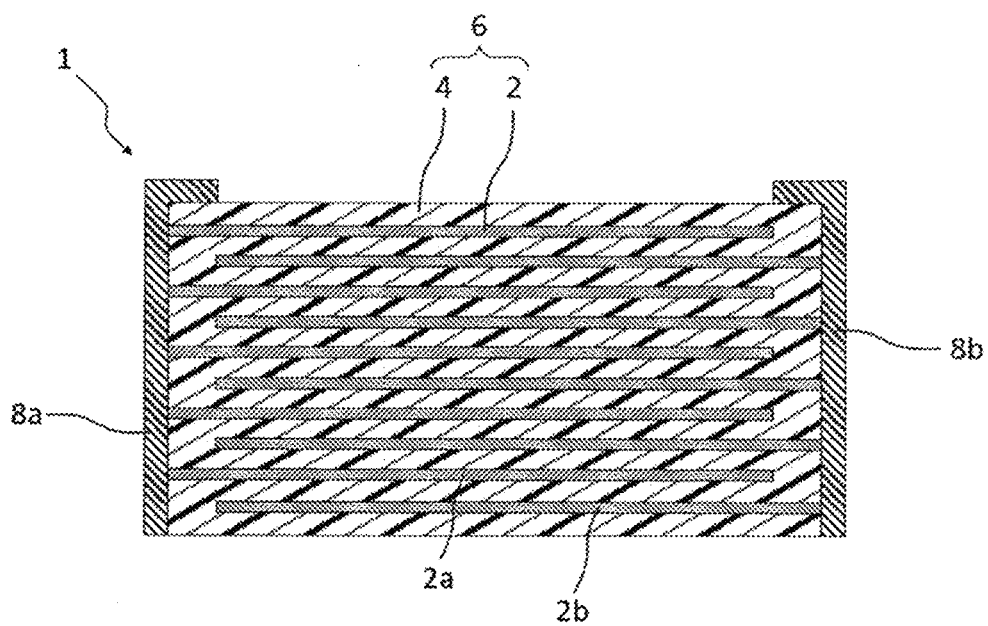
FIG. 1 is a schematic sectional view of an electrocaloric effect element according to a preferred embodiment of the present disclosure.

As shown in FIG. 1, an electrocaloric effect element 1 according to a preferred embodiment of the present invention includes a laminate 6 in which Pt electrode layers 2a and 2b (hereinafter, also collectively referred to as "Pt electrode layer 2") and a ceramic layer 4 are alternately stacked, and external electrodes 8a and 8b (hereinafter, also collectively referred to as "external electrode 8") connected to the Pt electrode layer 2. The Pt electrode layers 2a and 2b are electrically connected to the external electrodes 8a and 8b provided on an end surface of the laminate 6, respectively. When a voltage is applied from the external electrodes 8a and 8b, an electric field is generated between the Pt electrode layers 2a and 2b. This electric field causes the ceramic layer 4 to generate heat due to an electrocaloric effect. When the voltage is removed, the electric field disappears, and as a result, the ceramic layer 4 absorbs heat due to the electrocaloric effect.

The Pt electrode layer 2 is an internal electrode. The Pt electrode layer 2 can have a function of transferring a heat quantity between the ceramic layer 4 and the outside in addition to a function of applying the electric field to the ceramic layer 4.

The Pt electrode layer means an electrode layer mainly including Pt. Here, the "main component" in the electrode layer means that the electrode layer includes about 80% or more of Pt, and for example, means that about 95% by mass or more, more preferably about 98% or more, still more preferably about 99% or more, even more preferably about 99.5% or more, and particularly preferably about 99.9% or more of the electrode layer is Pt. However, from the viewpoint of improving chemical durability and/or cost, the Pt electrode layer may be an alloy or a mixture of Pt and another element (for example, Ag, Pd, Rh, Au, or the like). When the Pt electrode layer includes an alloy or a mixture thereof, the same or similar advantageous effects can be obtained. Other elements that can be mixed as impurities, particularly elements, for example, Fe, $Al_2O_3$, and the like, may be contained. In this case, the same or similar advantageous effects are achievable.

The thickness of the Pt electrode layer 2 can be preferably, for example, about 0.2 µm or more and about 10 µm or less, more preferably about 1.0 µm or more and about 5.0 µm or less, for example, about 2.0 µm or more and about 5.0 µm or less, or about 2.0 µm or more and about 4.0 µm or less. When the thickness of the Pt electrode layer is about 0.5 µm or more, resistance of the Pt electrode layer can be reduced, and heat transport efficiency can be increased. When the thickness of the Pt electrode layer is about 10 µm or less, the thickness (thus, volume) of the ceramic layer can be increased, and the heat quality that can be handled by the electrocaloric effect of the entire element can be further increased. In addition, the element can be made smaller.

In one aspect, the ceramic layer 4 is a layer having a perovskite structure and mainly including a ceramic containing Pb, Sc, and Ta. In the ceramic layer 4, when a content ratio of Sc is "y", a content ratio of Ta is "1−y", and a range of y is about 0.450≤y≤about 0.495. When y is within the above range, a withstand voltage of about 20 MV/m or more can be reproducibly obtained. It is possible to reproducibly obtain an order degree at a B site of about 75% or more, preferably about 80% or more, for example. In addition, when an annealing time is shortened, for example, about 100 to about 500 hours, it is possible to obtain an excellent withstand voltage and a high order degree, and productivity is further improved. In addition, when the thickness of the element is reduced, a high order degree can be obtained, and a degree of freedom in element design is improved.

In another aspect, the ceramic layer 4 has a perovskite structure and mainly includes a ceramic represented by the following formula:

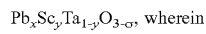, wherein x satisfies about 0.97≤x≤about 1.03,
y satisfies about 0.450≤y≤about 0.495,
σ satisfies about −0.1≤σ≤0.1.

When x, y, and σ are within the above ranges, a withstand voltage of about 20 MV/m or more can be reproducibly obtained. It is possible to reproducibly obtain the order degree at the B site of about 75% or more, and, in addition, when x is about 0.985≤x≤about 1.01, it is possible to reproducibly obtain the order degree at the B site of about 80% or more. In addition, when an annealing time is shortened, for example, about 100 to 500 hours, it is possible to obtain an excellent withstand voltage and a high order degree, and productivity is further improved. In addition, when the thickness of the element is reduced, a high order degree can be obtained, and a degree of freedom in element design is improved.

Although the present disclosure is not bound by any theory, a mechanism to obtain the above-described advantageous effects is considered as follows. In the prior art related to a single-plate sample of PST, since PST is a hardly sinterable substance, sinterability is improved by firing at a high temperature of about 1500° C. or higher (for example, Role of Defects in the Ferroelectric Relaxor lead Scandium Tantalate, J. Am. Ceram. Soc, 78 [71]1947-52 (1995)) or by using a hot press method capable of firing under pressure. However, in the case of a multilayer device according to a preferred embodiment of the present invention, co-sintering of Pt cannot be performed at a temperature of about 1450° C. or higher, and firing under pressure cannot be performed because an element structure is broken. Therefore, in the case of the multilayer device, sintering can be performed only at a temperature slightly lower than the ideal temperature. In addition, the Pt electrode layer sandwiching the ceramic layer prevents diffusion of oxygen, Pb, and the like, such that a diffusion coefficient of a cation defining the B site decreases, and it is assumed that it is difficult to obtain a high order degree. For the same or substantially the same reason, it is assumed that an inherent defect is likely to remain, and a variation in withstand voltage increases. In general, it has been considered that a ratio of Sc and Ta is preferably about 1:1 in order to increase the order degree. However, by providing a ceramic composition according to a preferred embodiment of the present invention, the order degree at the B site can be improved by facilitating diffusion, in addition, Pb, oxygen deficiency, and the like can be reduced, and the withstand voltage is also improved.

The ceramic layer 4 may mainly include one type of ceramic or two or more types of ceramics.

Here, the "main component" in the ceramic layer means that the ceramic layer is substantially made of a target ceramic, and for example, means that about 93% by mass or more, more preferably about 95% or more, still more preferably about 98% or more, even more preferably about 99.5% or more, and particularly preferably about 99.9% or more of the ceramic layer is the target ceramic. The other component may be a crystal phase having a structure different from the perovskite structure, which is a pyrochlore structure, other elements mixed as impurities, and particularly inevitable elements (for example, Zr, C, and the like).

The composition of the ceramic layer 4 can be determined, for example, by high-frequency inductively coupled plasma emission spectrometry, X-ray fluorescence spectrometry, or another method. The structure of the ceramic layer 4 can be determined by, for example, powder X-ray diffraction.

The thickness of the ceramic layer 4 can be preferably about 5 μm or more and about 50 μm or less, more preferably about 5 μm or more and about 45 μm or less, still more preferably about 5 μm or more and about 40 μm or less, and for example, about 10 μm or more and about 40 μm or less. By further increasing the thickness of the ceramic layer, the heat quality that can be handled by the element can be increased. By further reducing the thickness of the ceramic layer, the withstand voltage can be improved, and a higher ΔT can be obtained.

The order degree at the B site of the ceramic layer 4 can preferably be about 75% or more, more preferably about 80% or more, and still more preferably about 85% or more, for example. By further increasing the order degree at the B site, a larger electrocaloric effect can be obtained. The order degree at the B site of the ceramic layer is preferably as high as possible, and the upper limit thereof may be, for example, about 95% or less or about 99% or more. By further lowering the order degree at the B site, the annealing time at the time of manufacturing can be shortened, and the productivity is improved.

The order degree at the B site of the ceramic layer 4 can be determined based on the following formula from a measured value obtained by measuring intensities of 111 and 200 diffractions of the perovskite structure by powder X-ray diffraction and a calculated value obtained from a structure in which the B site is completely ordered.

$$S_{111}^2 = \frac{\left(\frac{I_{111}}{I_{200}}\right)_{observed}}{\left(\frac{I_{111}}{I_{200}}\right)_{calculated}}$$

Mathematical Formula 1

In the formula, $S^2_{111}$ represents the order degree, $I_{111}$ and $I_{200}$ represent the intensities of the 111 and 200 diffractions, respectively, observed represents a measured value, and calculated represents a calculated value.

The withstand voltage of the ceramic layer 4 can preferably be about 20 MV/m or more, more preferably about 22 MV/m or more, and still more preferably about 25 MV/m or more, for example. By further increasing the withstand voltage of the ceramic layer, a larger electric field can be applied, and a larger ΔT can be obtained.

The withstand voltage of the ceramic layer 4 is defined as a one-preceding applied voltage of a voltage at which dielectric breakdown of the ceramic layer 4 occurs by gradually increasing a charge, applied between the Pt electrode layer 2a and the Pt electrode layer 2b, at steps of about 50 V. For example, when the dielectric breakdown occurs at about 800 V, the withstand voltage is about 750 V.

A material of a pair of the external electrodes 8a and 8b is not particularly limited, examples thereof include Ag, Cu, Pt, Ni, Al, Pd, or Au, or alloys thereof (for example, Ag—Pd and the like), and an electrode including these metals and glass or an electrode including metal and resin may be used. Among the metals, for example, Ag is preferable.

In the electrocaloric effect element 1, the Pt electrode layer 2 and the ceramic layer 4 are alternately stacked. However, in the electrocaloric effect element of the present preferred embodiment, the number of stacked Pt electrode layers and ceramic layers is not particularly limited. All of the internal electrodes may not be connected to the external electrodes, and may include internal electrodes that are not connected to the external electrodes as necessary for heat transfer, stress relaxation due to piezoelectricity and electrostriction, and the like. For example, the lower limit of the number of stacked ceramic layers may be 1 or more, preferably 5 or more, for example, 10 or more, or 20 or more. The upper limit of the number of stacked ceramics may be several hundred or less, preferably 300 or less, more preferably 100 or less, for example, 50 or less.

In the electrocaloric effect element 1, the internal electrode and the ceramic layer are in contact with each other on the entire or substantially the entire surface. However, the electrocaloric effect elements of preferred embodiments of the present invention is not limited to such a structure, and is not particularly limited as long as it has a structure capable of applying the electric field to the ceramic layer. Although the electrocaloric effect element 1 has a rectangular or substantially rectangular parallelepiped block shape, the shape of the electrocaloric effect element is not limited thereto, and for example, the electrocaloric effect element may have a cylindrical or substantially cylindrical shape or a sheet shape, and may further have unevenness, a through hole, or the like, for example. The internal electrode may be exposed on a surface for heat transfer or heat exchange with the outside.

The electrocaloric effect element of the present preferred embodiment described above is manufactured, for example, as follows.

As raw materials, high purity lead oxide ($Pb_3O_4$), tantalum oxide ($Ta_2O_5$), and scandium oxide ($Sc_2O_3$) are weighed so as to have a desired composition ratio after firing. The above raw materials are pulverized and mixed with partially stabilized zirconia (PSZ) balls, pure water, a dispersant, and the like by a ball mill. Thereafter, a pulverized and mixed slurry is dried and sized, and then calcined under the conditions of, for example, about 800° C. to about 900° C. in the air. A calcined powder obtained is mixed with PSZ balls, ethanol, toluene, a dispersant, and the like and pulverized. Next, a dissolved binder solution is added to an obtained pulverized powder, and mixed to prepare a slurry for sheet molding. The prepared slurry is formed into a sheet shape on a support, and a Pt electrode paste is printed thereon. A printed sheet and an unprinted sheet are stacked so as to have a desired structure, then pressure-bonded at a pressure of about 100 MPa to about 200 MPa, for example, and cut to prepare a green chip. The green chip is heat-treated at, for example, about 500° C. to about 600° C. for about 24 hours in the air to perform a binder removal treatment. Next, the chip subjected to binder removal is fired at, for example, about 1300° C. to about 1500° C. together with a $PbZr)_3$ powder to create a Pb atmosphere using, for example, an alumina sealed sheath. After the firing, if necessary, the chip and the $PbZrO_3$ powder can be heat-treated again at, for example, about 1000° C. for a predetermined time to adjust the structure. Thereafter, an end surface of the chip is polished with sandpaper, an external electrode paste is applied, and baking treatment is performed at a predetermined temperature, so that an electrocaloric effect element as shown in FIG. 1 can be obtained.

Since the electrocaloric effect elements of preferred embodiments of the present invention provide an excellent electrocaloric effect, the electrocaloric effect element can be used as a heat management element, particularly as a cooling element.

Preferred embodiments of the present invention also provide an electronic component including an electrocaloric effect element according to a preferred embodiment of the present invention, and an electronic device including an electrocaloric effect element according to a preferred embodiment of the present invention or an electronic component according to a preferred embodiment of the present invention.

The electronic component is not particularly limited, and examples thereof include electronic components used in an air conditioner, a refrigerator, or a freezer, and components commonly used in, for example, electronic devices such as integrated circuits (ICs) such as a central processing unit (CPU), a hard disk (HDD), a power management IC (PMIC), a power amplifier (PA), a transceiver IC, and a voltage regulator (VR), light-emitting elements such as a light emitting diode (LED), an incandescent light bulb, and a semiconductor laser; components which can be a heat sources such as a field-effect transistors (FET), and other components, for example, a lithium ion battery, a substrate, a heat sink, a housing, and the like.

The electronic device is not particularly limited, and examples thereof include an air conditioner, a refrigerator, and a freezer, and small electronic devices such as a cellular phone, a smartphone, a personal computer (PC), a tablet terminal, a hard disc drive, and a data server.

EXAMPLES

Production of Electrocaloric Effect Element

As raw materials, high purity lead oxide ($Pb_3O_4$), tantalum oxide ($Ta_2O_5$), and scandium oxide ($Sc_2O_3$) were provided. These raw materials were weighed so as to have a predetermined composition ratio as shown in Tables 1 and 2 after firing, and pulverized and mixed with partially stabilized zirconia (PSZ) balls having a diameter of about 2 mm, pure water, and a dispersant by a ball mill for about 16 hours. Thereafter, a pulverized and mixed slurry was dried on a hot plate and sized, and then calcined for 2 hours under the condition of about 850° C. in the air, for example.

A calcined powder obtained was mixed with PSZ balls having a diameter of about 5 mm, ethanol, toluene, and a dispersant for about 16 hours, and pulverized, for example. Next, a dissolved binder solution was added to a pulverized powder obtained, and mixed for about 4 hours to prepare a slurry for sheet molding. The prepared slurry was formed into a sheet shape on a pet film by, for example, a doctor blade method in a thickness corresponding to a thickness of a predetermined ceramic layer, cut into strips, and then subjected to screen printing with a platinum internal electrode paste. An element thickness of a stacked element to be produced was controlled by changing a gap of a doctor blade used at the time of sheet formation.

A predetermined number of printed sheets and unprinted sheets were stacked, then pressure-bonded at a pressure of about 150 MPa, for example, and cut to prepare a green chip. The green chip was heat-treated at about 550° C. for about 24 hours in the air to perform the binder removal treatment. Next, the green chip was sealed in an alumina sealed sheath together with a $PbZrO_3$ powder to create a Pb atmosphere, and, for example, fired at about 1400° C. for about 4 hours. After the firing, the chip and the PbZrO3 powder were provided again with the sealed sheath, and heat treatment was performed at a temperature of about 1000° C. for about 1000 hours, for example.

Each sample having compositions shown in Tables 1 and 2 was prepared five times (five lots) under the same condition.

Thereafter, the end surface of the chip was polished with sandpaper, an Ag external electrode paste was applied, and baking treatment was performed at a temperature of about 750° C., for example, so that an electrocaloric effect element as shown in FIG. 1 was obtained (sample numbers 2 to 41).

Separately, a raw material was prepared so as to have the composition shown in Table 3, and an electrocaloric effect element was obtained (sample numbers 42 to 45) in the same or substantially the same manner as described above except that a green chip was fired together with a $PbZrO_3$ powder at about 1400° C. for about 4 hours with an alumina sealed sheath, and then heat-treated again with the $PbZrO_3$ powder with the sealed sheath for about 100 hours, about 300 hours, about 500 hours, or about 800 hours.

The size of the obtained element was, for example, about L 10.2 mm×W about 7.2 mm×T about 0.88 to about 1.7 mm (the thickness varies depending on the element thickness of the ceramic layer), the ceramic layer sandwiched between the internal electrode layers was 19 layers, and a total electrode area was about 49 mm²×19 layers.

As a comparative example, a single-plate element (about 10.2 mm×about 10.2 mm×about 0.48 mm) including no internal electrode layer was prepared (sample number 1).

The thickness of the ceramic layer of the element obtained above was confirmed using a scanning electron microscope after polishing a cross section of the element.

Evaluation

Composition

The ceramic composition of the obtained element was confirmed using high frequency inductively coupled plasma emission spectroscopy and X-ray fluorescence spectroscopy.

Crystal Structure and Order Degree

In order to evaluate the crystal structure and order degree (S111) of the obtained element, powder X-ray diffraction measurement was performed. One element was randomly selected from each lot and ground in a mortar to obtain an X-ray diffraction profile. From the obtained X-ray diffraction profile, it was confirmed whether the crystal structure of the ceramic was the perovskite structure, and the presence or absence and existence ratio of an impurity phase (mainly a pyrochlore phase) were estimated from an intensity ratio. The degree of order at the B site was estimated from the following calculation formula.

$$S_{111}^2 = \frac{\left(\frac{I_{111}}{I_{200}}\right)_{observed}}{\left(\frac{I_{111}}{I_{200}}\right)_{calculated}} \qquad \text{Mathematical Formula 2}$$

In the above formula, $I_{111}$ and $I_{200}$ were the intensities of the 111 and 200 diffractions of the perovskite structure, respectively, and the order degree at the B site was obtained from the measured value and a calculated value obtained from a structure in which the B site was completely ordered. The results are shown in Table 1, Table 2, and Table 3. In the tables, a maximum value and a minimum value of the order degree were shown for reference, the order degree of about 75% or more was defined as a good lot, and a good lot rate was obtained. As a determination criterion, a case where the good lot rate was about 100% was determined as Go determination. When an abundance ratio of the pyrochlore phase determined from an intensity ratio of powder X-ray diffraction was about 7% or less, the main component was determined to have the perovskite structure, and was shown in the tables. Samples marked with "*" in the table are Comparative Examples, and other samples are Examples.

Withstand Voltage and Electrocaloric Effect

Figure 2:
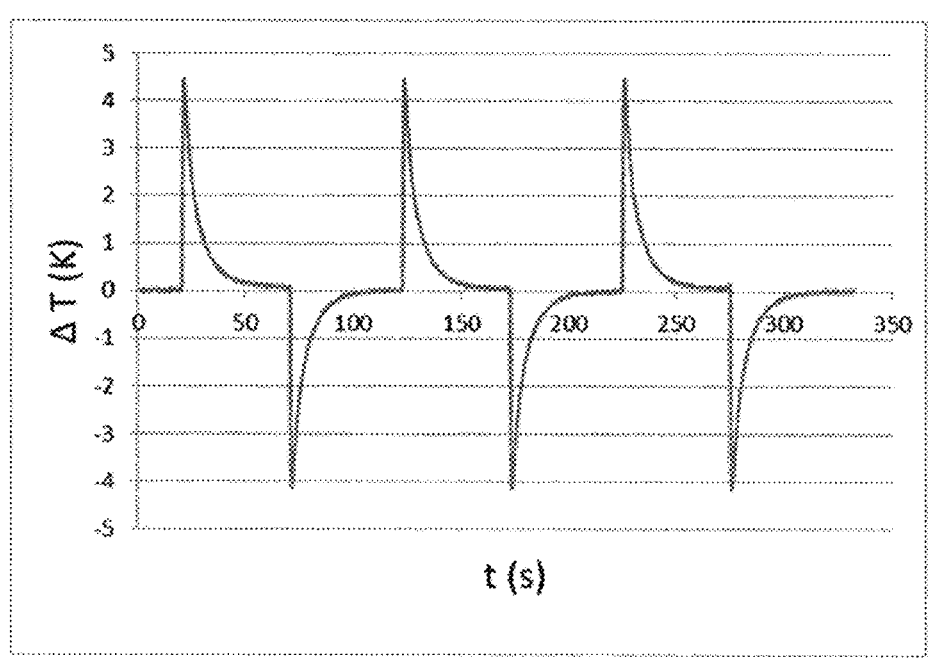
FIG. 2 is a graph showing a measurement result of an electrocaloric effect of a sample No. 7 in an example.

For five elements in each lot (that is, for each composition and a total of 25 elements), the withstand voltage and the electrocaloric effect were evaluated. Specifically, an ultra-fine K thermocouple having a diameter of about 50 μm was attached to a central portion of an element surface with a Kapton tape, the temperature was constantly monitored, a wire for voltage application was bonded to both ends of the external electrode with an Ag paste, and a voltage was applied using a high voltage generator. After the application of the voltage, the temperature was measured by being held in a state where the voltage was applied for about 50 seconds, and then after the voltage was removed, the temperature was measured by being held in a state where no voltage was applied for about 50 seconds. This sequence was repeated three times. During the sequence of voltage application and voltage removal, the temperature of the element was constantly measured, and the adiabatic temperature change $\Delta T$ was obtained from the temperature change (in this case, the temperature change when a voltage was applied, that is, the degree of temperature rise was defined as $\Delta T$). This measurement was performed while gradually increasing the voltage from about 300 V to about 1000 V at steps of about 50 V. At this time, the one-preceding applied voltage of the voltage at which the dielectric breakdown occurred was defined as a maximum allowable applied voltage, and the withstand voltage (MV/m) was determined from the element thickness. The withstand voltage of the element having the lowest withstand voltage was defined as a minimum withstand voltage. The element having a withstand voltage of about 20 MV/m or more was defined as a good product, and a good product rate was calculated. The results are shown in Table 1 and Table 2. The element having a good product rate of about 100% was determined as Go determination. FIG. 2 shows a measurement result of the electrocaloric effect of a sample No. 7 (about 20 MV/m).

TABLE 1

| | $Pb_xSc_yTa_{1-y}O_3$ | | Order degree at B site | | Characteristic test result | | | | | |
|---|---|---|---|---|---|---|---|---|---|---|
| | | | | | | Withstand voltage | | $\Delta T$ at minimum | | |
| Sample No. | x | y | Maximum | Minimum | Good lot rate | Good product rate | Minimum withstand voltage (MV/m) | withstand voltage (K)@30° C. | Crystal structure | Ceramic layer thickness |
| * 1 | 0.5 | 0.5 | 88 | 81 | 100% | — | — | — | Perovskite structure | Single plate |
| * 2 | 0.5 | 0.5 | 88 | 81 | 100% | — | — | — | Perovskite structure | 80 μm |
| * 3 | 0.5 | 0.5 | 90 | 68 | 60% | — | — | — | Perovskite structure | 50 μm |
| * 4 | 0.5 | 0.5 | 95 | 70 | 60% | 72% | — | — | Perovskite structure | 40 μm |
| * 5 | 0.499 | 0.501 | 88 | 70 | 40% | 68% | — | — | Perovskite structure | 40 μm |
| 6 | 0.495 | 0.505 | 95 | 90 | 100% | 100% | — | 4.8 | Perovskite structure | 40 μm |
| 7 | 0.48 | 0.51 | 92 | 90 | 100% | 100% | — | 4.5 | Perovskite structure | 40 μm |
| 8 | 0.485 | 0.515 | 95 | 87 | 100% | 100% | — | 4.6 | Perovskite structure | 40 μm |
| 9 | 0.45 | 0.55 | 92 | 85 | 100% | 100% | — | 4.5 | Perovskite structure | 40 μm |
| * 10 | 0.44 | 0.56 | 85 | 72 | 60% | 80% | — | — | Perovskite structure | 40 μm |
| 11 | 0.49 | 0.51 | 95 | 91 | 100% | 100% | — | 4.5 | Perovskite structure | 50 μm |
| * 12 | 1 | 0.5 | 90 | 68 | 60% | — | — | — | Perovskite structure | 50 μm |
| * 13 | 1 | 0.5 | 95 | 70 | 60% | 72% | — | — | Perovskite structure | 40 μm |
| * 14 | 1.015 | 0.5 | 85 | 64 | 60% | 64% | — | — | Perovskite structure | 40 μm |
| * 15 | 0.985 | 0.5 | 82 | 61 | 60% | 72% | — | — | Perovskite structure | 40 μm |
| * 16 | 1 | 0.499 | 88 | 68 | 40% | 68% | — | — | Perovskite structure | 40 μm |
| 17 | 1 | 0.495 | 95 | 90 | 100% | 100% | 25 | 4.6 | Perovskite structure | 40 μm |

TABLE 1-continued

| | $Pb_xSc_yTa_{1-y}O_3$ | | Order degree at B site | | Characteristic test result | | | | | |
|---|---|---|---|---|---|---|---|---|---|---|
| | | | | | | Withstand voltage Good | Minimum good | ΔT at minimum withstand | | |
| Sample No. | x | y | Maximum | Minimum | lot rate | product rate | voltage (MV/m) | voltage (K)@30° C. | Crystal structure | Ceramic layer thickness |
| 18 | 1 | 0.49 | 92 | 90 | 100% | 100% | 25 | 4.7 | Perovskite structure | 40 μm |
| 19 | 1 | 0.485 | 95 | 87 | 100% | 100% | 22.5 | 4.9 | Perovskite structure | 40 μm |
| 20 | 1 | 0.45 | 92 | 85 | 100% | 100% | 25 | 4.8 | Perovskite structure | 40 μm |

TABLE 2

| | $Pb_xSc_yTa_{1-y}O_3$ | | Order degree at B site | | Characteristic test result | | | | | |
|---|---|---|---|---|---|---|---|---|---|---|
| | | | | | | Withstand voltage Good | Minimum good | ΔT at minimum withstand | | |
| Sample No. | x | y | Maximum | Minimum | lot rate | product rate | voltage (MV/m) | voltage (K)@30° C. | Crystal structure | Ceramic layer thickness |
| * 21 | 1 | 0.44 | 85 | 70 | 60% | 80% | 17.5 | — | Perovskite structure | 40 μm |
| * 22 | 1.015 | 0.499 | 83 | 71 | 80% | 72% | 17.5 | — | Perovskite structure | 40 μm |
| 23 | 1.015 | 0.495 | 91 | 85 | 100% | 100% | 22.5 | 4.6 | Perovskite structure | 40 μm |
| 24 | 1.015 | 0.49 | 91 | 85 | 100% | 100% | 25 | 4.8 | Perovskite structure | 40 μm |
| 25 | 1.015 | 0.485 | 88 | 85 | 100% | 100% | 25 | 4.5 | Perovskite structure | 40 μm |
| 26 | 1.015 | 0.45 | 84 | 83 | 100% | 100% | 22.5 | 4.5 | Perovskite structure | 40 μm |
| * 27 | 1.015 | 0.44 | 82 | 70 | 60% | 72% | 15 | — | Perovskite structure | 40 μm |
| 28 | 1.03 | 0.495 | 81 | 76 | 100% | 100% | 20 | 4.1 | Perovskite structure | 40 μm |
| 29 | 1.03 | 0.45 | 85 | 77 | 100% | 100% | 20 | 4.1 | Perovskite structure | 40 μm |
| * 30 | 0.985 | 0.499 | 80 | 72 | 80% | 76% | 17.5 | — | Perovskite structure | 40 μm |
| 31 | 0.985 | 0.495 | 95 | 87 | 100% | 100% | 25 | 4.8 | Perovskite structure | 40 μm |
| 32 | 0.985 | 0.49 | 90 | 85 | 100% | 100% | 22.5 | 4.5 | Perovskite structure | 40 μm |
| 33 | 0.985 | 0.485 | 94 | 87 | 100% | 100% | 22.5 | 4.5 | Perovskite structure | 40 μm |
| 34 | 0.985 | 0.45 | 94 | 85 | 100% | 100% | 25 | 4.8 | Perovskite structure | 40 μm |
| * 35 | 0.985 | 0.44 | 81 | 71 | 60% | 68% | 16.25 | — | Perovskite structure | 40 μm |
| 36 | 0.97 | 0.495 | 82 | 75 | 100% | 100% | 20 | 4.2 | Perovskite structure | 40 μm |
| 37 | 0.97 | 0.45 | 81 | 76 | 100% | 100% | 20 | 4.1 | Perovskite structure | 40 μm |
| * 38 | 1.05 | 0.495 | — | — | — | — | — | — | 10% or more of pyrochlore phase | 40 μm |
| * 39 | 1.05 | 0.45 | — | — | — | — | — | — | 10% or more of pyrochlore phase | 40 μm |
| * 40 | 0.95 | 0.495 | — | — | — | — | — | — | 10% or more of pyrochlore phase | 40 μm |

TABLE 2-continued

| | $Pb_xSc_yTa_{1-y}O_3$ | | Order degree at B site | | Characteristic test result | | | | | |
|---|---|---|---|---|---|---|---|---|---|---|
| | | | | | | Withstand voltage | | ΔT at minimum | | |
| | | | | | Good lot rate | good product rate | Minimum withstand voltage (MV/m) | minimum withstand voltage (K)@30° C. | Crystal structure | Ceramic layer thickness |
| Sample No. | x | y | Maximum | Minimum | | | | | | |
| * 41 | 0.95 | 0.45 | — | — | — | — | — | — | 10% or more of pyrochlore phase | 40 μm |

TABLE 3

| | | $Pb_xSc_yTa_{1-y}O_3$ | | Order degree at B site (S111) | | | | |
|---|---|---|---|---|---|---|---|---|
| Sample No. | Heat treatment time (h) | x | y | First | Second | Third | Fourth | Fifth |
| 42 | 800 | 1 | 0.49 | 88 | 85 | 90 | 91 | 85 |
| 43 | 500 | 1 | 0.49 | 86 | 90 | 91 | 87 | 82 |
| 44 | 300 | 1 | 0.49 | 85 | 85 | 85 | 88 | 85 |
| 45 | 100 | 1 | 0.49 | 80 | 81 | 80 | 81 | 81 |

As shown in Table 1 and Table 2, when the composition of the PST ceramic was within the range of preferred embodiments of the present invention, both the good lot rate of the order degree at the B site and the good product rate of the withstand voltage were about 100%, and it was confirmed that an element having a high level of order degree and withstand voltage was stably obtained. When the composition of the PST ceramic was within the range of preferred embodiments of the present invention, it was confirmed that ΔT was also a high value. As shown in Table 3, it was confirmed that when the composition of the PST ceramic was within the range of preferred embodiments of the present invention, the order degree of about 80% or more could be obtained by short-time heat treatment.

Since the electrocaloric effect elements of preferred embodiments of the present disclosure can provide a high electrocaloric effect, the electrocaloric effect element can be used as, for example, a heat management element in an air conditioner, a refrigerator, a freezer, or the like, and can be used as a cooling device for various electronic devices, for example, small electronic devices such as mobile phones in which a heat countermeasure problem is significant.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electrocaloric effect element comprising:
a laminate including an electrode layer mainly including Pt and a ceramic layer that are stacked; wherein
the electrode layer mainly includes Pt such that Pt has a largest % by mass in the electrode layer;
the ceramic layer has a perovskite structure and mainly includes a ceramic including Pb, Sc, and Ta, a content ratio of Sc is y, a content ratio of Ta is 1-y, and a range of the y is about $0.450 \leq y \leq$ about 0.495; and
the ceramic layer mainly includes the ceramic such that the ceramic has a largest % by mass in the ceramic layer.

2. The electrocaloric effect element according to claim 1, wherein the ceramic layer in the laminate has a thickness of about 50 μm or less.

3. An electronic component comprising the electrocaloric effect element according to claim 1.

4. The electronic component according to claim 3, wherein the ceramic layer in the laminate has a thickness of about 50 μm or less.

5. The electrocaloric effect element according to claim 1, further comprising at least one external electrode connected to the electrode layer.

6. The electrocaloric effect element according to claim 1, wherein the electrode layer is an internal electrode layer provided in the laminate.

7. The electrocaloric effect element according to claim 1, wherein the Pt included in the electrode layer includes about 80% by mass or more of Pt.

8. The electrocaloric effect element according to claim 1, wherein the Pt included in the electrode layer includes about 95% by mass or more of Pt.

9. The electrocaloric effect element according to claim 1, wherein the Pt included in the electrode layer includes about 98% by mass or more of Pt.

10. An electrocaloric effect element comprising:
a laminate including an electrode layer mainly including Pt and a ceramic layer that are stacked; wherein
the electrode layer mainly includes Pt such that Pt has a largest % by mass in the electrode layer;
the ceramic layer has a perovskite structure and mainly includes a ceramic represented by a formula $Pb_xSc_yTa_{1-y}O_{3-\sigma}$, where x satisfies about $0.97 \leq x \leq$ about 1.03, y satisfies about $0.450 \leq y \leq$ about 0.495, and σ satisfies $-0.1 \leq \sigma \leq 0.1$; and the ceramic layer mainly includes the ceramic such that the ceramic has a largest % by mass in the ceramic layer.

11. The electrocaloric effect element according to claim 10, wherein x satisfies $0.985 \leq x \leq 1.015$.

12. The electrocaloric effect element according to claim 10, wherein the ceramic layer in the laminate has a thickness of about 50 μm or less.

13. An electronic component comprising the electrocaloric effect element according to claim 10.

14. The electronic component according to claim 13, wherein x satisfies $0.985 \leq x \leq 1.015$.

15. The electronic component according to claim 13, wherein the ceramic layer in the laminate has a thickness of about 50 μm or less.

16. The electrocaloric effect element according to claim 10, further comprising at least one external electrode connected to the electrode layer.

17. The electrocaloric effect element according to claim 10, wherein the electrode layer is an internal electrode layer provided in the laminate.

18. The electrocaloric effect element according to claim 10, wherein the Pt included in the electrode layer includes about 80% by mass or more of Pt.

19. The electrocaloric effect element according to claim 10, wherein the Pt included in the electrode layer includes about 95% by mass or more of Pt.

20. The electrocaloric effect element according to claim 10, wherein the Pt included in the electrode layer includes about 98% by mass or more of Pt.

* * * * *